United States Patent
Dozaka

(10) Patent No.: US 12,125,552 B2
(45) Date of Patent: Oct. 22, 2024

(54) DETERMINATION CIRCUIT AND CORRECTION METHOD

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Toshiaki Dozaka, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 508 days.

(21) Appl. No.: 17/469,172

(22) Filed: Sep. 8, 2021

(65) Prior Publication Data

US 2022/0302137 A1 Sep. 22, 2022

(30) Foreign Application Priority Data

Mar. 22, 2021 (JP) ................................ 2021-046861

(51) Int. Cl.
*G11C 7/00* (2006.01)
*G11C 7/06* (2006.01)
*G11C 11/417* (2006.01)

(52) U.S. Cl.
CPC ............ *G11C 7/065* (2013.01); *G11C 11/417* (2013.01)

(58) Field of Classification Search
CPC ..... G11C 11/4091; G11C 7/065; G11C 7/062; G11C 7/06; G11C 7/067

USPC ........................................................ 365/207
See application file for complete search history.

(56) References Cited

U.S. PATENT DOCUMENTS

| | | | |
|---|---|---|---|
| 6,370,060 B2 | 4/2002 | Takata et al. | |
| 6,462,999 B1 | 10/2002 | Amano | |
| 6,504,776 B1 | 1/2003 | Nakaoka | |
| 6,842,377 B2 | 1/2005 | Takano et al. | |
| 7,013,118 B2 * | 3/2006 | Darabi ................. | H03G 3/3052 |
| | | | 375/345 |
| 9,178,499 B2 * | 11/2015 | Venkiteswaran ....... | H03M 1/38 |
| 9,742,361 B2 | 8/2017 | Yoshida et al. | |
| 10,128,802 B2 | 11/2018 | Yoshida et al. | |
| 2015/0341001 A1 | 11/2015 | Yoshida et al. | |

(Continued)

FOREIGN PATENT DOCUMENTS

| | | |
|---|---|---|
| JP | 2002-184188 A | 6/2002 |
| JP | 2003-196982 A | 7/2003 |

(Continued)

*Primary Examiner* — Son T Dinh
(74) *Attorney, Agent, or Firm* — Knobbe, Martens, Olson & Bear, LLP

(57) ABSTRACT

A determination circuit according to an embodiment includes a first capacitive element that has one end connected to an input terminal of a differential pair included in a differential type determination circuit, and shifts a potential of the input terminal so as to reduce a potential fluctuation of the input terminal that occurs due to start of operation of the differential pair. Therefore, in a clock synchronization latch type determination circuit, a potential fluctuation during operation can be suppressed without increasing an installation area more than necessary, and determination can be performed with high accuracy.

17 Claims, 15 Drawing Sheets

(56) References Cited

U.S. PATENT DOCUMENTS

2017/0317652 A1    11/2017  Yoshida et al.
2019/0259454 A1*   8/2019   Yabuuchi ............... G11C 15/04

FOREIGN PATENT DOCUMENTS

| JP | 2003-308698 A | 10/2003 |
| JP | 3651767 B2    | 5/2005  |
| JP | 2007-280570 A | 10/2007 |
| JP | 2015-220714 A | 12/2015 |

* cited by examiner

DETERMINATION CIRCUIT AND CORRECTION METHOD

CROSS-REFERENCE TO RELATED APPLICATIONS

This application is based upon and claims the benefit of priority from Japanese Application No. 2021-046861, filed on Mar. 22, 2021, the entire contents of which are incorporated herein by reference.

FIELD

Embodiments described herein relate generally to a determination circuit and a correction method.

BACKGROUND

Conventionally, a clock synchronization latch type determination circuit is known as a determination circuit that determines the potential of a bit cell constituting a memory circuit of a static random-access memory (SRAM).

In this clock synchronization latch type determination circuit, a synchronous amplifier and a latch are connected in cascade to each other, a determination time is shorter than that of a determination circuit using a conventional analog amplifier, and a data reading time can be shortened.

Patent Literature 1: JP 2002-184188 A
Patent Literature 2: JP 2003-308698 A

Meanwhile, a reference voltage is supplied via a common reference voltage line to a plurality of clock synchronization latch type determination circuits corresponding to a plurality of bit lines constituting a memory circuit including a memory cell of a single bit line.

Therefore, due to coupling noise during operation, an input potential fluctuates more greatly on the reference voltage line side than on the bit line side, and there is a possibility that determination cannot be performed correctly in a case where the fluctuation amount is large.

Therefore, for conventional reading of a single bit line from a memory cell, a technique has been proposed in which a capacitive element is added in order to suppress a potential fluctuation during operation of a determination circuit and perform correct determination.

However, when the capacitive element is added, there is a problem that the installation area of the determination circuit increases and high integration of the memory cannot be achieved.

The present invention has been made in view of the above, and an object of the present invention is to provide a determination circuit and a correction method capable of performing determination with high accuracy by suppressing a potential fluctuation during operation without increasing an installation area more than necessary in a clock synchronization latch type determination circuit.

DETAILED DESCRIPTION

Next, preferred embodiments will be described with reference to the drawings.

Figure 1:
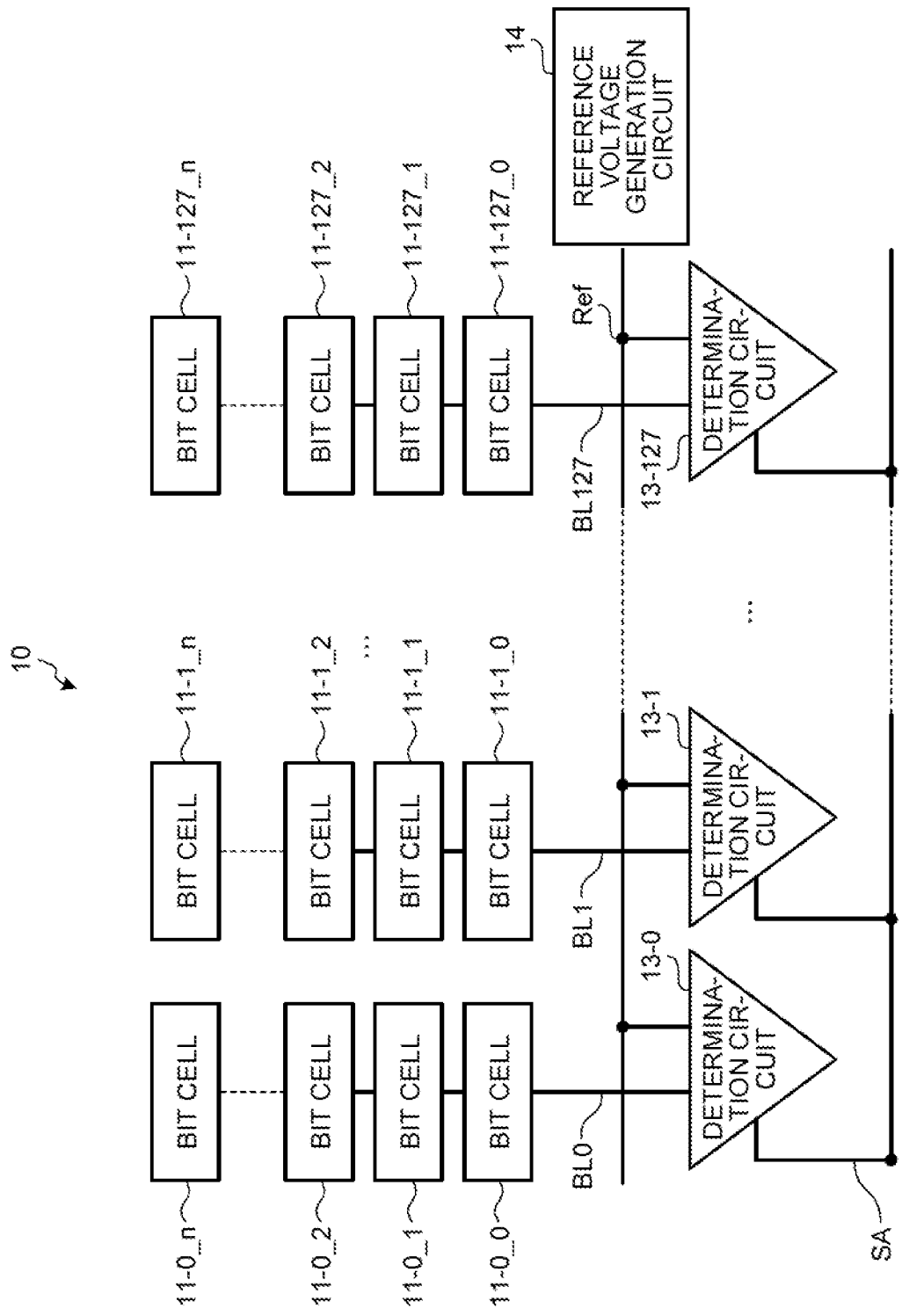
FIG. 1 is a block diagram illustrating a schematic configuration of a main part of a single bit line memory including a determination circuit according to an embodiment.

FIG. 1 is a block diagram illustrating a schematic configuration of a main part of a single bit line memory including a determination circuit according to an embodiment.

A memory array 10 according to the embodiment includes a plurality of bit cells 11-0_0 to 11-127_n, a plurality of determination circuits 13-0 to 13-127, and a reference voltage generation circuit 14.

In the following description, when it is not necessary to identify the determination circuits 13-0 to 13-127, each of the determination circuits 13-0 to 13-127 is referred to as a determination circuit 13.

One input terminal of each of the determination circuits 13-0 to 13-127 is connected to a corresponding one of bit lines BL0 to BL127, and a reference voltage Ref generated by the reference voltage generation circuit 14 is commonly input to the other input terminal of each of the determination circuits 13-0 to 13-127.

In addition, a sense amplifier operation control signal SA is input to enable terminals of the determination circuits 13-0 to 13-127.

[1] First Embodiment

Figure 2:
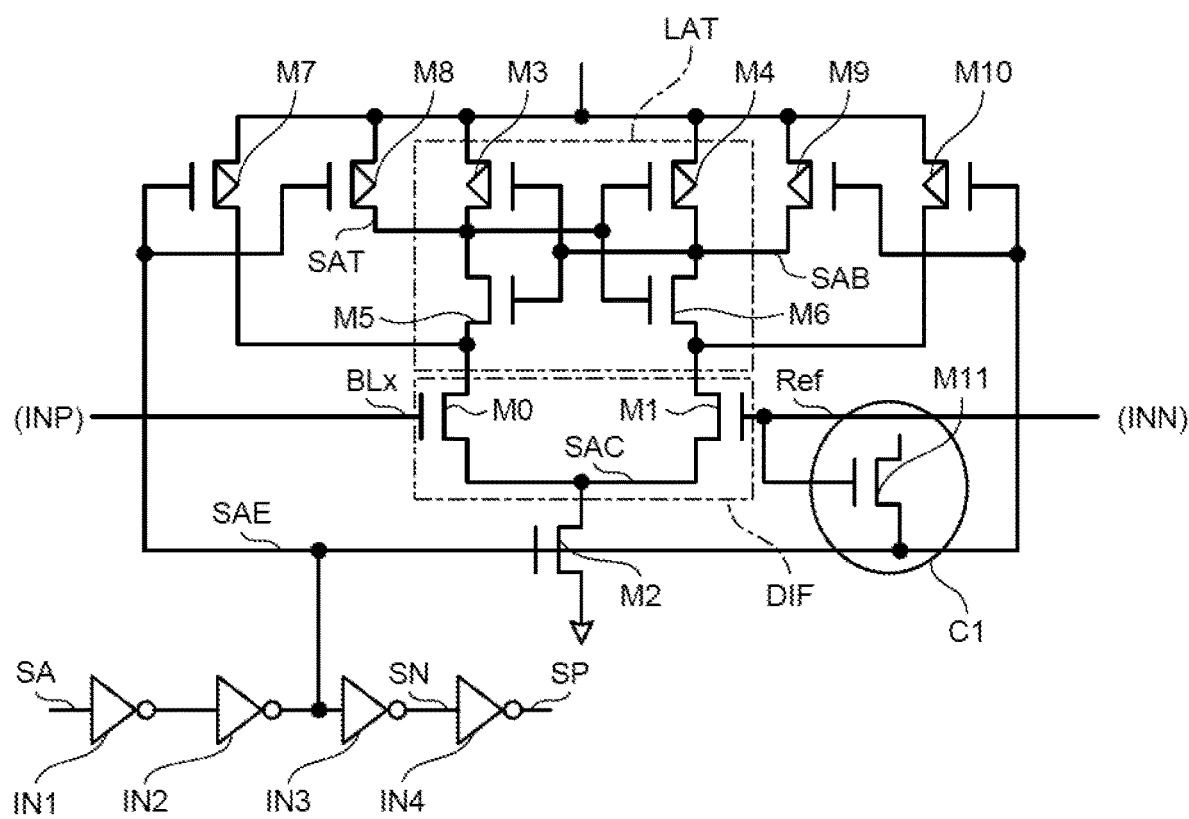
FIG. 2 is an explanatory diagram of an exemplary circuit configuration of a determination circuit according to a first embodiment.

FIG. 2 is an explanatory diagram of an exemplary circuit configuration of a determination circuit according to a first embodiment.

The determination circuit 13 according to the first embodiment includes a differential pair DIF, a latch circuit LAT, a clock input circuit including P-channel MOS transistors (P-channel MOSFETs) M7 to M10, a signal conversion circuit including inverters IN1 to IN4, an N-channel MOS transistor (N-channel MOSFET) M11, and an N-channel MOS transistor M2.

Here, the N-channel MOS transistor M11 functions as a capacitive element.

The differential pair DIF includes an N-channel MOS transistor M0 having a gate terminal connected to a bit line BLx corresponding to the gate terminal, a drain terminal connected to the latch circuit LAT, and a source terminal connected to the drain terminal of the N-channel MOS transistor M2, and an N-channel MOS transistor M1 having a gate terminal connected to the reference voltage generation circuit 14, a drain terminal connected to the latch circuit LAT, and a source terminal connected to the drain terminal of the N-channel MOS transistor M2.

The latch circuit LAT includes a P-channel MOS transistor M3 having a drain terminal connected to a high-potential-side power supply VDD, a P-channel MOS transistor M4 having a drain terminal connected to the high-potential-side power supply VDD, an N-channel MOS transistor M5 having a drain terminal connected to the source terminal of the P-channel MOS transistor M3 and a source terminal connected to the drain terminal of the N-channel MOS transistor M0, and an N-channel MOS transistor M6 having a drain terminal connected to the source terminal of the P-channel MOS transistor M4 and a source terminal connected to the drain terminal of the N-channel MOS transistor M1.

In the above configuration, in the latch circuit LAT, the gate terminal of the P-channel MOS transistor M3 and the gate terminal of the N-channel MOS transistor M5 are connected to each other, and are connected to the connection point of the source terminal of the P-channel MOS transistor M4 and the drain terminal of the N-channel MOS transistor M6.

Furthermore, the connection point of the source terminal of the P-channel MOS transistor M3 and the drain terminal of the N-channel MOS transistor M5 is connected to the source terminal of the P-channel MOS transistor M8 constituting the clock input circuit.

In addition, the gate terminal of the P-channel MOS transistor M4 and the gate terminal of the N-channel MOS transistor M6 are connected to each other, and are connected to the connection point of the source terminal of the P-channel MOS transistor M3 and the drain terminal of the N-channel MOS transistor M5.

Furthermore, the connection point of the source terminal of the P-channel MOS transistor M4 and the drain terminal of the N-channel MOS transistor M6 is connected to the source terminal of the P-channel MOS transistor M9 constituting the clock input circuit.

In addition, the clock input circuit includes the P-channel MOS transistor M7 having a source terminal connected to the high-potential-side power supply VDD and a drain terminal connected to the drain terminal of the N-channel MOS transistor M0, and the P-channel MOS transistor M8 having the source terminal connected to the high-potential-side power supply VDD, a drain terminal connected to the drain terminal of the N-channel MOS transistor M5, and a gate terminal connected to the gate terminal of the P-channel MOS transistor M7.

Furthermore, the clock input circuit includes the P-channel MOS transistor M9 having the source terminal connected to the high-potential-side power supply VDD and a drain terminal connected to the drain terminal of the N-channel MOS transistor M6, and the P-channel MOS transistor M10 having a source terminal connected to the high-potential-side power supply VDD, a drain terminal connected to the drain terminal of the N-channel MOS transistor M1, and a gate terminal connected to the gate terminal of the P-channel MOS transistor M9.

The signal conversion circuit includes the inverter IN1 that has an input terminal to which the sense amplifier operation control signal SA is input, and inverts and outputs the sense amplifier operation control signal SA, the inverter IN2 that has an input terminal connected to an output terminal of the inverter IN1 and inverts the input signal and outputs a determination circuit enable signal SAE, the inverter IN3 that has an input terminal connected to an output terminal of the inverter IN2 and inverts the input determination circuit enable signal SAE and outputs a signal SN, and the inverter IN4 that has an input terminal connected to an output terminal of the inverter IN3 and inverts the input signal SN and outputs a signal SP.

In the above configuration, the determination circuit enable signal SAE is input to the gate terminals of the P-channel MOS transistors M7 to M10 constituting the clock input circuit.

In addition, the N-channel MOS transistor M11 illustrated in a circle C1 has a function of suppressing a potential fluctuation during operation of the determination circuit 13, and has a gate terminal connected to the reference voltage generation circuit 14, a drain terminal in a floating state, and a source terminal that is connected to the output terminal of the inverter IN2 and to which the determination circuit enable signal SAE is input.

The N-channel MOS transistor M2 has a gate terminal that is connected to the output terminal of the inverter IN2 and to which the determination circuit enable signal SAE is input, the drain terminal connected to the source terminal of the N-channel MOS transistor M0 and the source terminal of the N-channel MOS transistor M1, and a source terminal connected to a low-potential-side power supply.

Before describing operation according to the first embodiment, problems of a conventional determination circuit will be described for easy understanding of the embodiments. Each embodiment is not limited to the conventional determination circuit.

Figure 3:
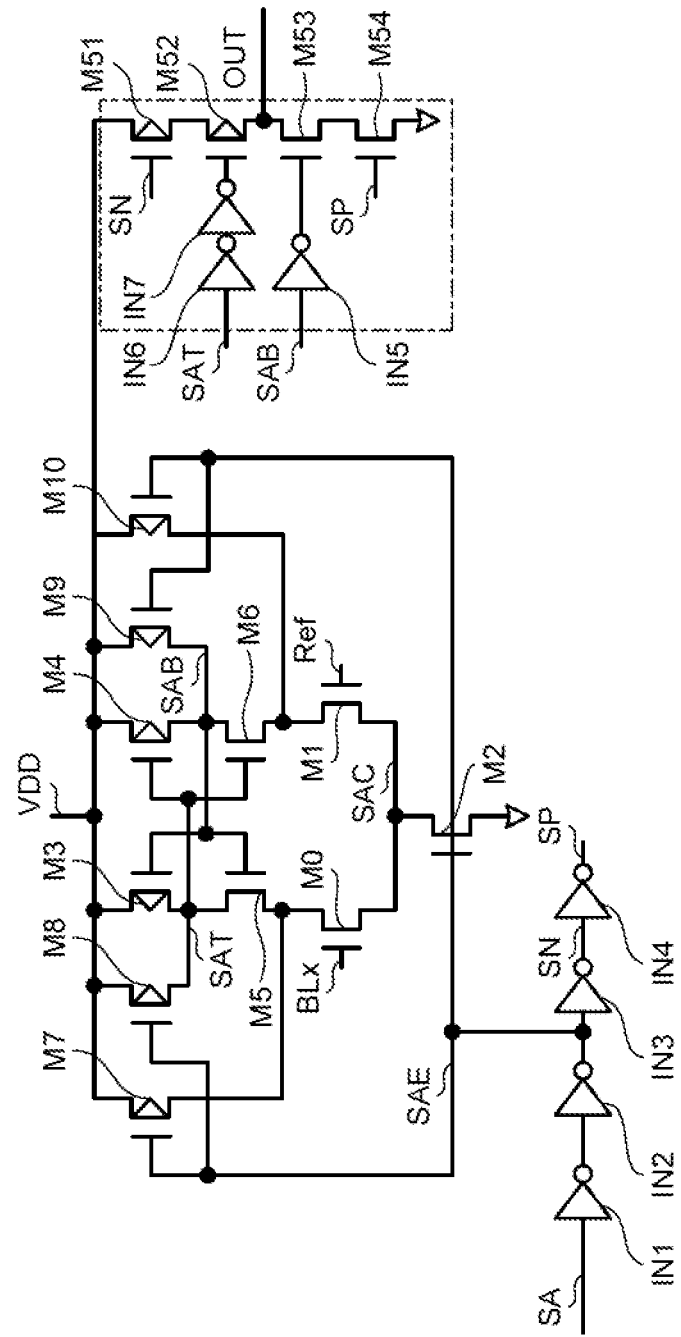
FIG. 3 is an explanatory diagram of an exemplary circuit configuration of a conventional clock synchronization latch type determination circuit.

FIG. 3 is an explanatory diagram of an exemplary circuit configuration of a conventional clock synchronization latch type determination circuit.

In FIG. 3, the same components as those illustrated in FIG. 2 are denoted by the same reference signs, and the detailed description thereof is incorporated.

FIG. 3 also illustrates an output circuit included in the determination circuit and not illustrated in FIG. 2.

In the above configuration, the conventional clock synchronization latch type determination circuit 13P is different from the clock synchronization latch type determination circuit illustrated in FIG. 2 in that the N-channel MOS transistor M11 functioning as a capacitive element is not provided.

The output circuit includes inverters IN5 to IN7, P-channel MOS transistors M51 and M52, and N-channel MOS transistors M53 and M54.

A signal SAB corresponding to the potential of the source terminal of the P-channel MOS transistor M4 is input to an input terminal of the inverter IN5, and an output terminal of the inverter IN5 is connected to the gate terminal of the N-channel MOS transistor M53.

Further, a signal SAT corresponding to the potential of the source terminal of the P-channel MOS transistor M3 is input to an input terminal of the inverter IN6, and an output terminal of the inverter IN6 is connected to an input terminal of the inverter IN7.

An inverted signal of the signal SAT is input from the inverter IN6 to the input terminal of the inverter IN7, and the output terminal of the inverter IN7 is connected to the gate terminal of the P-channel MOS transistor M52.

The P-channel MOS transistor M51 has a drain terminal connected to a high-potential-side power supply VDD, a source terminal connected to the drain terminal of the P-channel MOS transistor M52, and a gate terminal to which a signal SN, which is an inverted signal of the determination circuit enable signal SAE, is input from the inverter IN3.

The P-channel MOS transistor M52 has a gate terminal connected to an output terminal of the inverter IN7 and a source terminal connected to an output terminal OUT of the determination circuit 13P.

The N-channel MOS transistor M53 has a drain terminal connected to the output terminal OUT, a gate terminal connected to an output terminal of the inverter IN5, and a source terminal connected to the drain terminal of the N-channel MOS transistor M54.

A signal SP (=determination circuit enable signal SAE effectively delayed by two gates), which is an inverted signal of the signal SN, is input from the inverter IN4 to the gate terminal of the N-channel MOS transistor M54.

Figure 4:
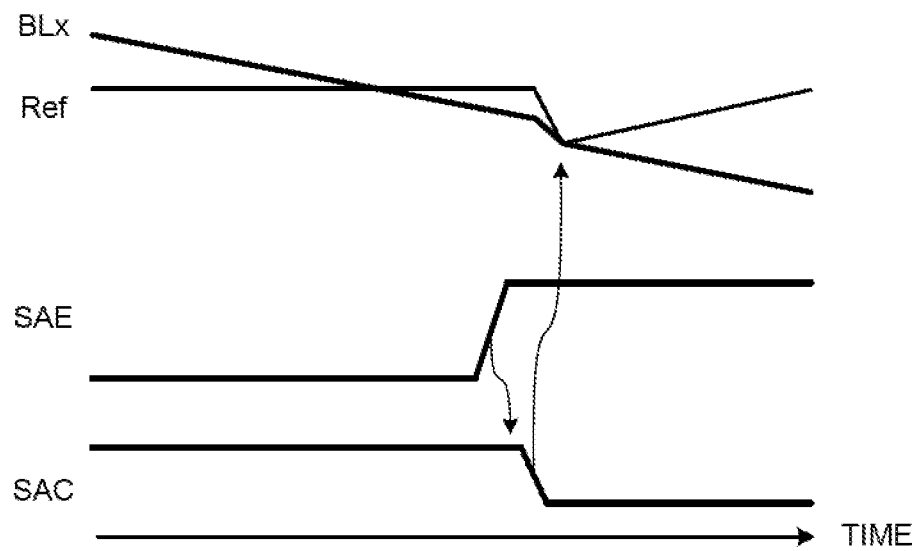
FIG. 4 is a diagram illustrating a problem of the conventional determination circuit.

FIG. 4 is a diagram illustrating a problem of the conventional determination circuit.

In the conventional clock synchronization latch type determination circuit 13P, when determination time comes and the determination circuit enable signal SAE transitions from the "L" level to the "H" level as illustrated in FIG. 4, the N-channel MOS transistor M2 to which the determination circuit enable signal SAE is input via the gate terminal is delayed by a predetermined time and turned on, and a signal SAC corresponding to the potentials of the source terminals of the N-channel MOS transistors M0 and M1 transitions to the "L" level.

As a result, the reference voltage Ref is applied from the reference voltage generation circuit 14 to all the clock synchronization latch type determination circuits 13P, but is subjected to a potential fluctuation proportional to the number of connections of the clock synchronization latch type determination circuits 13P, and as illustrated in FIG. 4, the voltage of a bit line BLx is only subjected to a potential fluctuation only affected by the one bit line BLx.

Therefore, as illustrated in FIG. 4, there is a possibility that the difference between the potential of the bit line BLx and the potential of the reference voltage Ref becomes small, or the potential of the bit line BLx and the potential of the reference voltage Ref are reversed, and correct determination cannot be performed.

In order to avoid this problem, it is necessary to suppress the fluctuation of the potential of the reference voltage Ref, and it is necessary to add a capacitive element. However, due to the addition of the installation area of the capacitive element, effective high integration of a memory circuit cannot be achieved.

Here, the description will be given with reference to FIG. 2 again.

Therefore, in the first embodiment, the N-channel MOS transistor M11A is provided.

The N-channel MOS transistor 11 is formed by the same process as the N-channel MOS transistor M1, and is of the same type and size as the N-channel MOS transistor M1.

Figure 5:
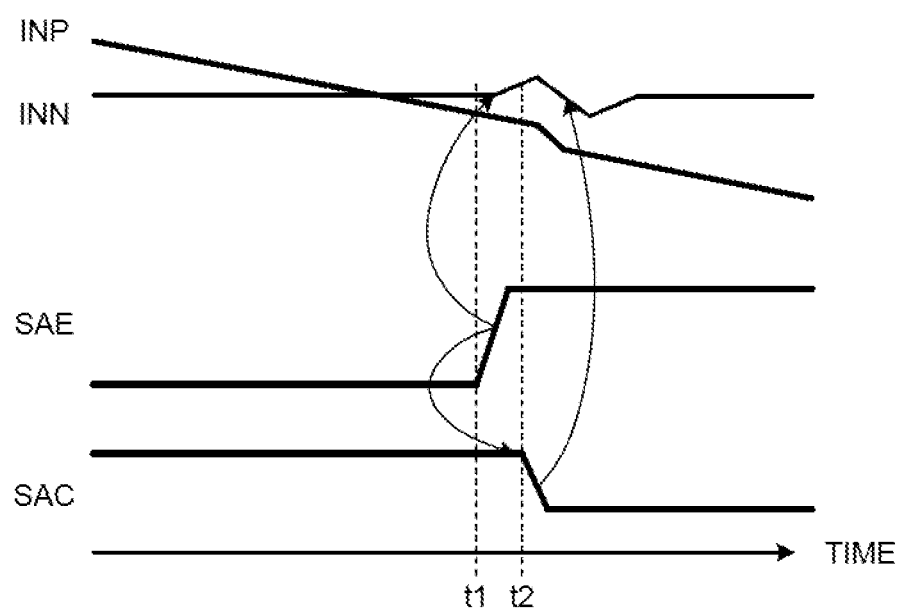
FIG. 5 is an explanatory operation diagram according to the first embodiment.

FIG. 5 is an explanatory operation diagram according to the first embodiment.

In the clock synchronization latch type determination circuit 13, when determination time comes and the determination circuit enable signal SAE transitions from the "L" level to the "H" level at time t1 as illustrated in FIG. 5, the reference voltage Ref corresponding to an input signal INN accordingly causes a potential fluctuation (voltage rise) proportional to the number of connections of the clock synchronization latch type determination circuits 13.

Thereafter, the N-channel MOS transistor M2 to which the determination circuit enable signal SAE is input via the gate terminal is turned on at time t2 delayed by a predetermined time, and the signal SAC corresponding to the potentials of the source terminals of the N-channel MOS transistors M0 and M1 transitions to the "L" level.

At this time, the input signal INN (=reference voltage Ref) of the reference voltage generation circuit 14 is applied to all the clock synchronization latch type determination circuits 13, and the reference voltage Ref corresponding to the input signal INN is subjected to a potential fluctuation (voltage drop) proportional to the number of connections of the clock synchronization latch type determination circuits 13.

However, according to the first embodiment, the reference voltage Ref is raised via the parasitic capacitance between the gate terminal and the source terminal of the N-channel MOS transistor M11, the potential fluctuation (voltage drop) caused by the transition of the signal SAC to the "L" level is reduced, and the potential fluctuation is suppressed.

On the other hand, the potential fluctuation of an input signal INP corresponding to the corresponding bit line BLx remains as it is.

Therefore, as illustrated in FIG. 5, the difference between the potential of the input signal INP corresponding to the bit line BLx and the potential of the reference voltage Ref corresponding to the input signal INN is larger than that in the conventional example (see FIG. 4) in which the N-channel MOS transistor M11 is not provided, and correct determination can be performed.

In this case, since the installation area of the N-channel MOS transistor M11 is very small as compared with a capacitive element necessary for suppressing a similar potential fluctuation, high integration of the memory circuit can be more easily achieved.

As described above, according to the first embodiment, it is possible to suppress the potential fluctuation of the reference voltage Ref and perform determination with high accuracy in the clock synchronization latch type determination circuit 13 without hindering high integration of the memory circuit.

Furthermore, the reading time can be reduced.

[1.1] First Modification of First Embodiment

Figure 6:
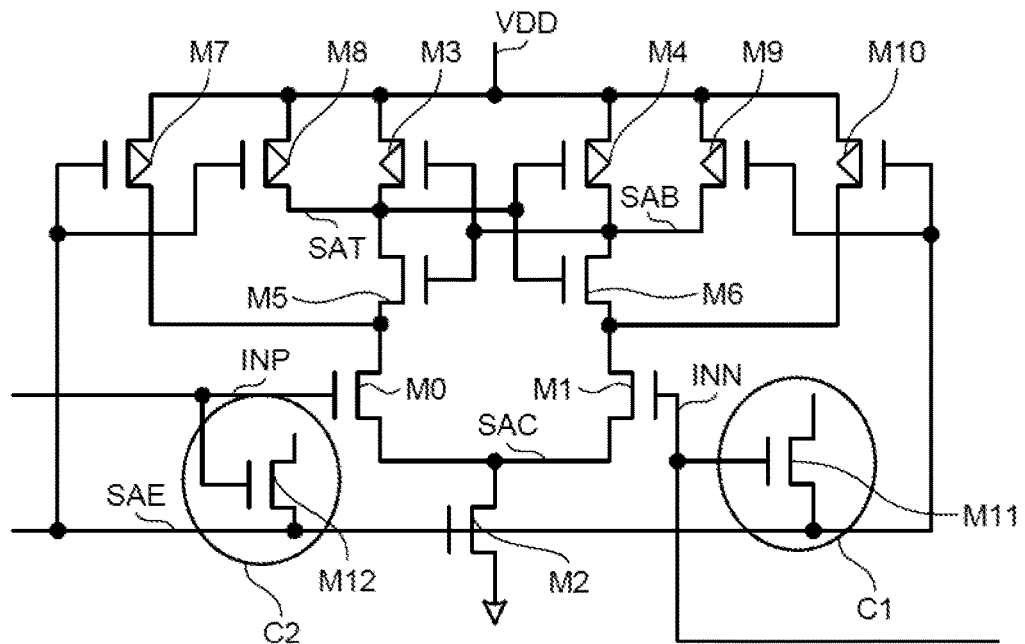
FIG. 6 is an explanatory diagram of an exemplary circuit configuration of a determination circuit according to a first modification of the first embodiment.

FIG. 6 is an explanatory diagram of an exemplary circuit configuration of a determination circuit according to a first modification of the first embodiment.

In FIG. 6, the same components as those described in the first embodiment with reference to FIG. 2 are denoted by the same reference signs.

The first modification of the first embodiment is different from the first embodiment in that an N-channel MOS transistor M12 is provided as illustrated in a circle C2.

The N-channel MOS transistor M12 also functions as a capacitive element similarly to the N-channel MOS transistor M11.

Here, the gate terminal of the N-channel MOS transistor M12 is connected to the corresponding bit line BLx, and the input signal INP is applied to the gate terminal of the N-channel MOS transistor M12.

In addition, the N-channel MOS transistor M12 has a drain terminal in a floating state, and a source terminal that is connected to the output terminal of the inverter IN2 and to which the determination circuit enable signal SAE is input.

Furthermore, the N-channel MOS transistor M12 is formed by the same process as the N-channel MOS transistor M0, and is of the same type and size as the N-channel MOS transistor M0.

According to the clock synchronization latch type determination circuit 13 of the first modification of the first embodiment, in addition to the functions and effects of the first embodiment, the voltage of the input signal INP of the corresponding bit line BLx is raised via the parasitic capacitance between the gate terminal and the source terminal of the N-channel MOS transistor M12, the potential fluctuation (voltage drop) is reduced, and the potential fluctuation is suppressed.

Therefore, as compared with the case of the first embodiment, a fluctuation in the voltage of the input signal INP of the bit line BLx can also be suppressed, so that a more reliable determination result can be obtained.

[1.2] Second Modification of First Embodiment

Figure 7:
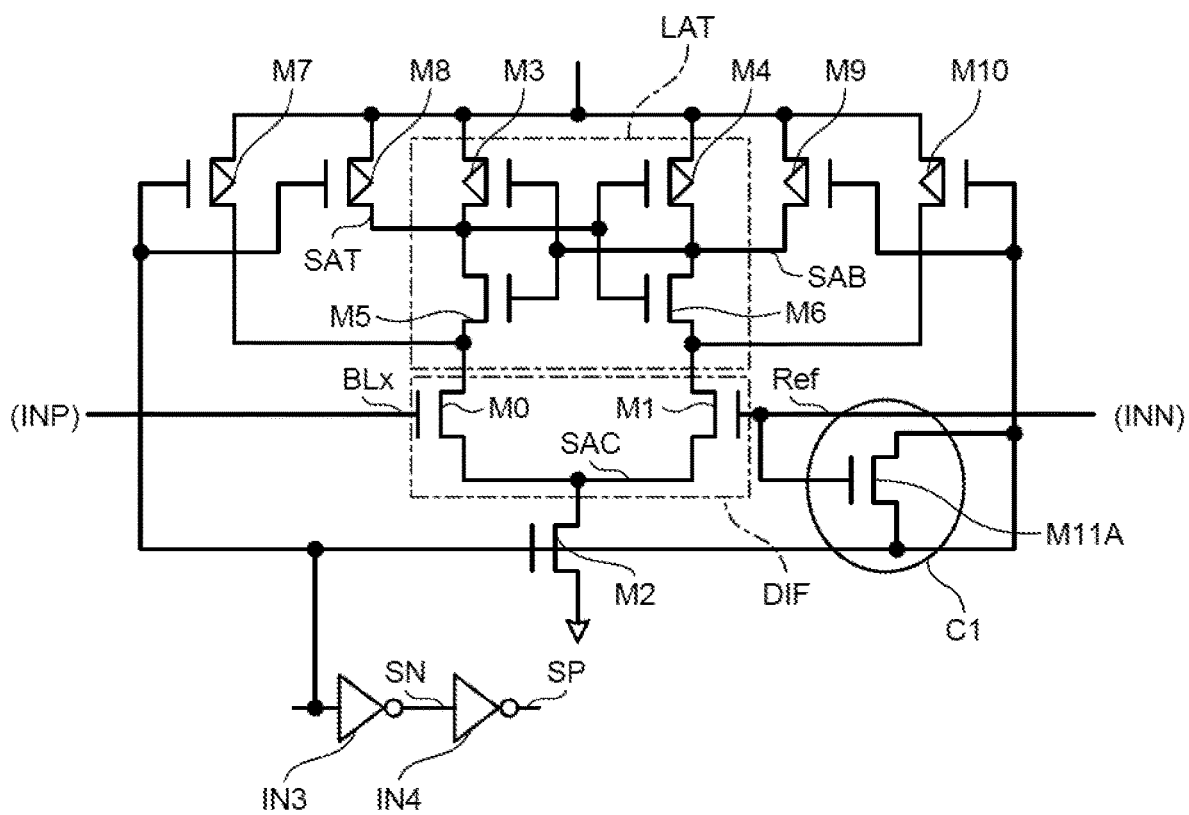
FIG. 7 is an explanatory diagram of an exemplary circuit configuration of a determination circuit according to a second modification of the first embodiment.

FIG. 7 is an explanatory diagram of an exemplary circuit configuration of a determination circuit according to a second modification of the first embodiment.

In FIG. 7, the same components as those described in the first embodiment with reference to FIG. 2 are denoted by the same reference signs.

The second modification of the first embodiment is different from the first embodiment in that the drain terminal of an N-channel MOS transistor M11A is connected to the output terminal of the inverter IN2 similarly to the source terminal of the N-channel MOS transistor M11A, and the determination circuit enable signal SAE is input to the drain terminal of the N-channel MOS transistor M11A, as illustrated in a circle C1.

According to the second modification of the first embodiment, as compared with the first modification of the first embodiment, the potential state of the N-channel MOS transistor M11A can be stabilized, and stable operation can be expected.

[1.3] Third Modification of First Embodiment

Figure 8:
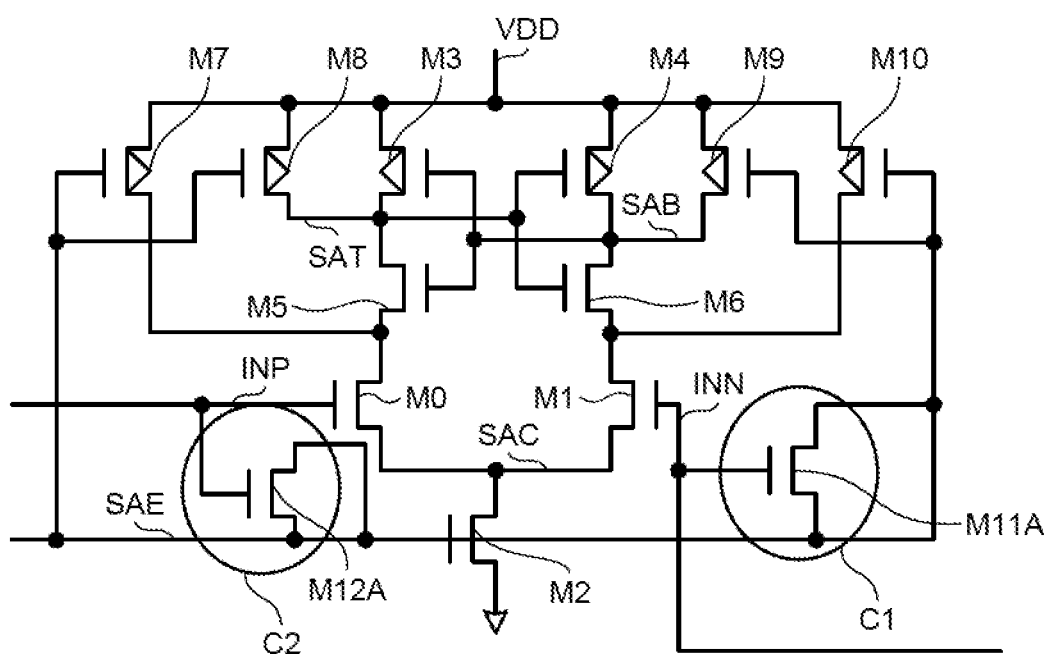
FIG. 8 is an explanatory diagram of an exemplary circuit configuration of a determination circuit according to a third modification of the first embodiment.

FIG. 8 is an explanatory diagram of an exemplary circuit configuration of a determination circuit according to a third modification of the first embodiment.

In FIG. 8, differences from the determination circuit according to the first modification of the first embodiment in FIG. 6 are that the drain terminal of the N-channel MOS transistor M11A is connected to the output terminal of the inverter IN2 similarly to the source terminal of the N-channel MOS transistor M11A and the determination circuit enable signal SAE is input to the drain terminal of the N-channel MOS transistor M11 as illustrated in a circle C1, and that the drain terminal of an N-channel MOS transistor M12A is connected to the output terminal of the inverter IN2 similarly to the source terminal of the N-channel MOS transistor M12A and the determination circuit enable signal SAE is input to the drain terminal of the N-channel MOS transistor M12A as illustrated in a circle C2.

According to the third modification of the first embodiment, as compared with the first modification of the first embodiment, the potential states of the N-channel MOS transistors M11A and M12A can be stabilized, and stable operation can be expected.

[2] Second Embodiment

Next, a second embodiment will be described.

In the first embodiment, the transition of the determination circuit enable signal SAE that causes the potential fluctuation (voltage rise) of the potential of the reference voltage Ref corresponding to the input signal INN and the transition of the signal SAC to the "L" level that causes the potential fluctuation (voltage drop) of the potential of the reference voltage Ref corresponding to the input signal INN are different factors.

Therefore, the effect of suppressing the potential fluctuation of the potential of the reference voltage Ref corresponding to the input signal INN fluctuates and varies depending on the driving capability of the N-channel MOS transistor M2. For example, when the temperature condition or the voltage condition fluctuates, the suppression effect changes.

Therefore, the second embodiment provides an embodiment for more stably obtaining the effect of suppressing the potential fluctuation of the potential of the reference voltage Ref corresponding to the input signal INN even when the temperature condition and the voltage condition fluctuate.

Figure 9:
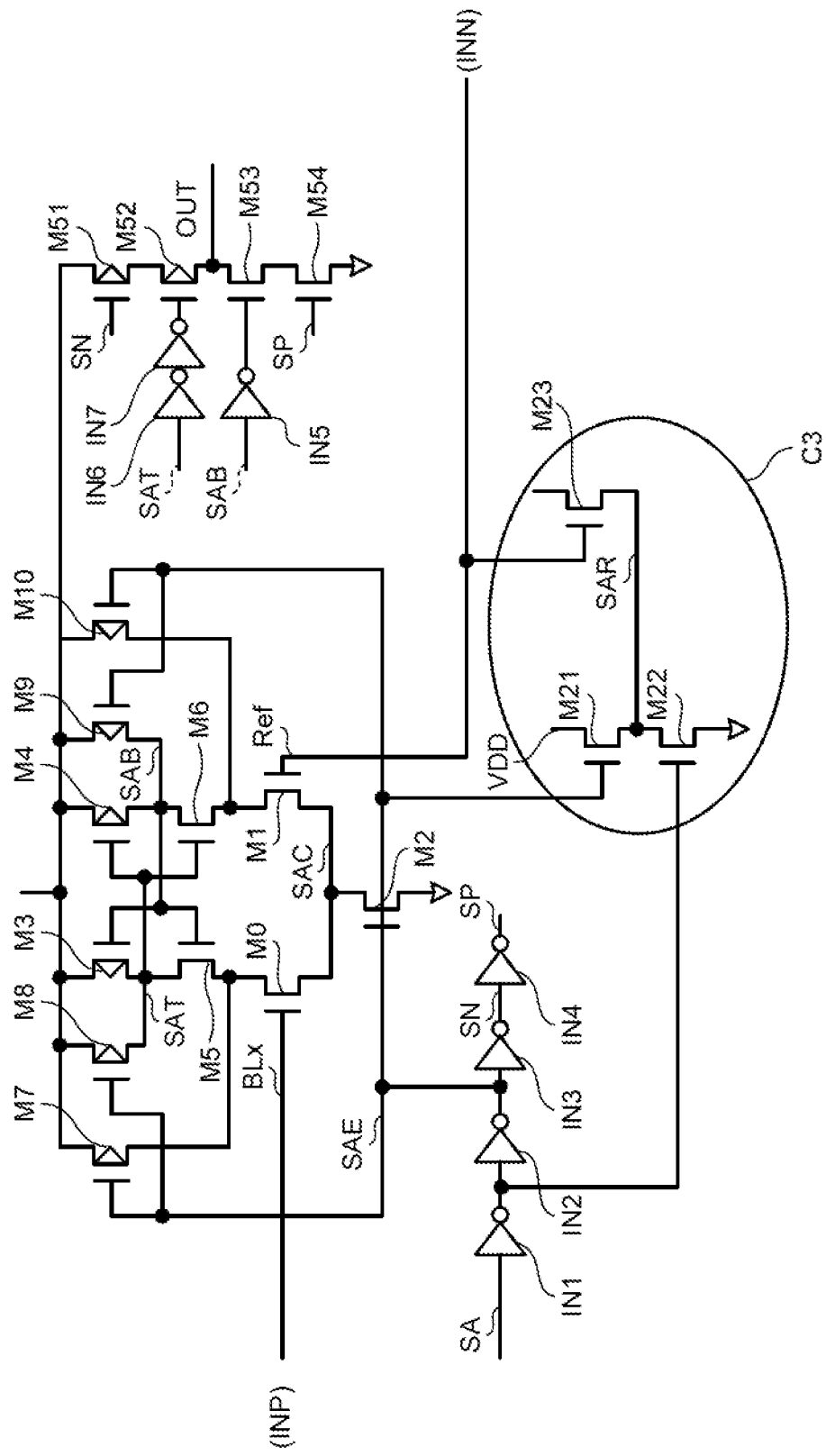
FIG. 9 is an explanatory diagram of an exemplary circuit configuration of a determination circuit according to a second embodiment.

FIG. 9 is an explanatory diagram of an exemplary circuit configuration of a determination circuit according to the second embodiment.

In FIG. 9, the same components as those described with reference to FIG. 2 or 3 are denoted by the same reference signs.

The determination circuit 13A according to the second embodiment is different from the conventional example of FIG. 3 in that the determination circuit 13A includes an N-channel MOS transistor M21 having a gate terminal connected to the output terminal of the inverter IN2 and a drain terminal connected to the high-potential-side power supply VDD, an N-channel transistor M22 having a gate terminal connected to the output terminal of the inverter IN1, a drain terminal connected to the source terminal of the N-channel MOS transistor M21, and a source terminal connected to the low-potential-side power supply VSS, and an N-channel MOS transistor M23 having a gate terminal connected to the reference voltage generation circuit 14, a drain terminal in a floating state, and a source terminal connected to the connection point of the source terminal of the N-channel MOS transistor M21 and the drain terminal of the N-channel MOS transistor M22, and the signal SAR is input to the source terminal of the N-channel MOS transistor M23, as illustrated in an ellipse C3.

Here, the N-channel MOS transistor M23 functions as a first capacitive element.

In the above configuration, the N-channel MOS transistor M21 is provided to perform a coupling operation of the N-channel MOS transistor M23 in synchronization with a coupling operation of the N-channel MOS transistor M2. The N-channel MOS transistor M21 is formed by the same process as the N-channel MOS transistor M2, and is of the same type and size as the N-channel MOS transistor M2.

In addition, the N-channel MOS transistor M22 functions as a discharge transistor for discharging the signal SAR.

Furthermore, the N-channel MOS transistor M23 functions as a capacitive element and is formed by the same process as the N-channel MOS transistor M1.

The N-channel MOS transistor M23 is of the same type and size as the N-channel MOS transistor M1.

Figure 10:
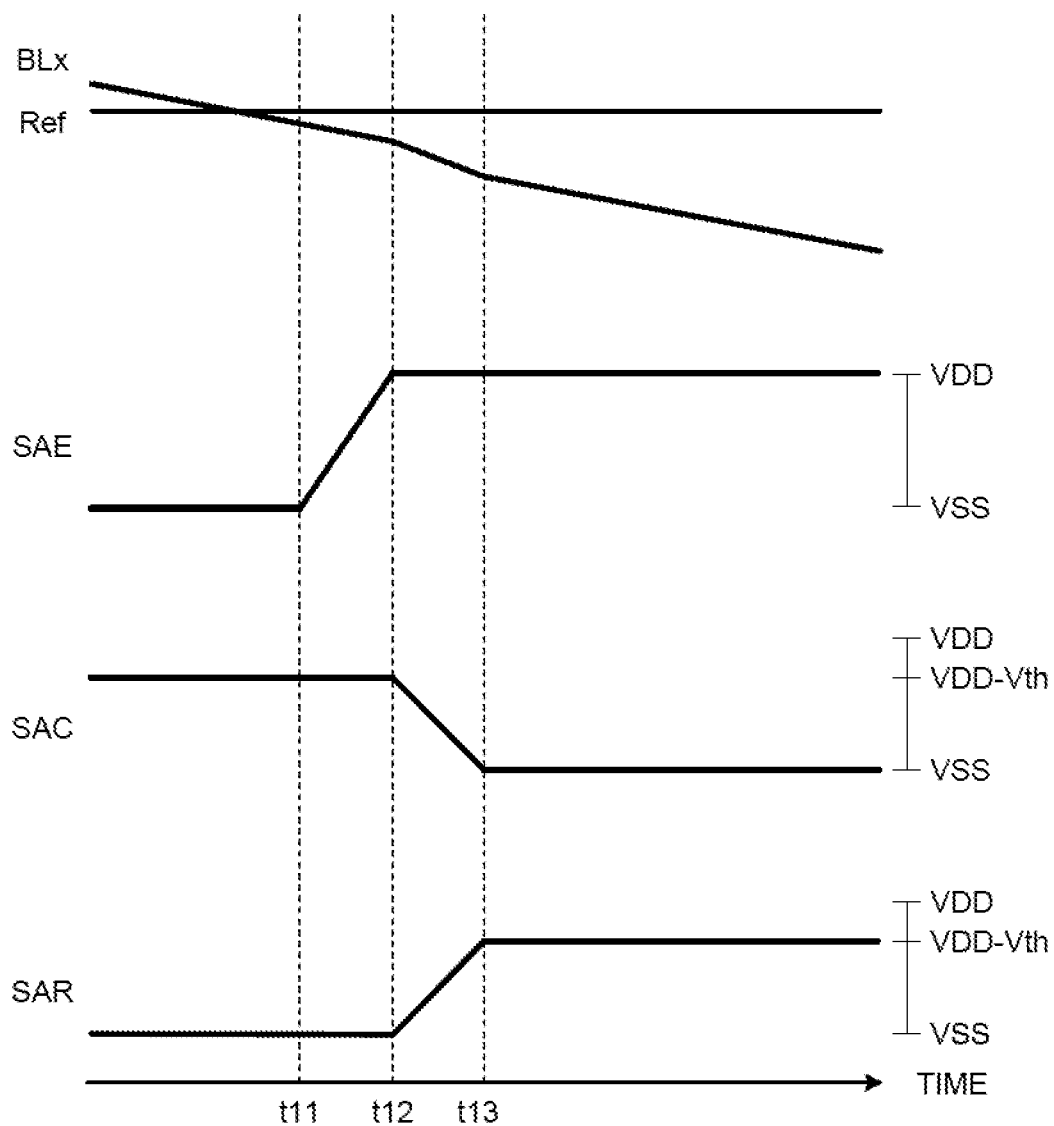
FIG. 10 is an explanatory operation diagram according to the second embodiment.

FIG. 10 is an explanatory operation diagram according to the second embodiment.

In the clock synchronization latch type determination circuit 13A, when determination time comes, as illustrated in FIG. 10, at time t11, the determination circuit enable signal SAE transitions from the "L" level that is the potential level of the low-potential-side power supply VSS to the "H" level that is the potential level of the high-potential-side power supply VDD.

As a result, the N-channel MOS transistor M2 to which the determination circuit enable signal SAE is input via gate terminal starts to transition to the ON state and is turned on at time t12 delayed by a predetermined time.

Then, the signal SAC corresponding to the potential of the source terminals of the N-channel MOS transistors M0 and M1 transitions from the "H" level, which is a potential level (VDD-Vth) lowered by a threshold voltage Vth for the transistors than from the potential level of the high-potential-side power supply VDD, to the "L" level, which is the potential level of the low-potential-side power supply VSS, at time t13.

In parallel with this, at time t11, the N-channel MOS transistor M21 to which the determination circuit enable signal SAE is input via the gate terminal starts to transition to the ON state and is turned on at time t12 delayed by a predetermined time.

At this time, since the output of the inverter IN1 is at the "L" level, the N-channel MOS transistor M22 remains in the OFF state.

Therefore, the signal SAR at the connection point of the source terminal of the N-channel MOS transistor M21 and the drain terminal of the N-channel MOS transistor M22 starts to transition from the "L" level, which is the potential level of the low-potential-side power supply VSS, to the "H" level, which is the potential level (VDD-Vth) lowered by the threshold voltage Vth for the transistors from the potential level of the high-potential-side power supply VDD, at time t12.

Then, at time t13, the signal SAR transitions from the "L" level, which is the potential level of the low-potential-side power supply VSS, to the "H" level, which is the potential level (VDD-Vth) lowered by the threshold voltage Vth for the transistors from the potential level of the high-potential-side power supply VDD.

As a result, the timing of the voltage fluctuation caused by the transition of the signal SAC matches the timing of applying the signal to cancel the voltage fluctuation by the N-channel MOS transistor M23 based on the signal SAR.

Therefore, as illustrated in FIG. 10, the potential fluctuation of the reference voltage Ref can be suppressed only by adding the three N-channel MOS transistors M21 to M23.

Also in this case, since the installation area of the three N-channel MOS transistors M21 to M23 is smaller than that of a capacitive element necessary for suppressing a similar potential fluctuation, high integration of the memory circuit can be more easily achieved.

As described above, according to the second embodiment, it is also possible to suppress the potential fluctuation of the reference voltage Ref and perform determination with high accuracy in the clock synchronization latch type determination circuit 13A without hindering high integration of the memory circuit.

Furthermore, the reading time can be reduced.

[2.1] First Modification of Second Embodiment

Figure 11:
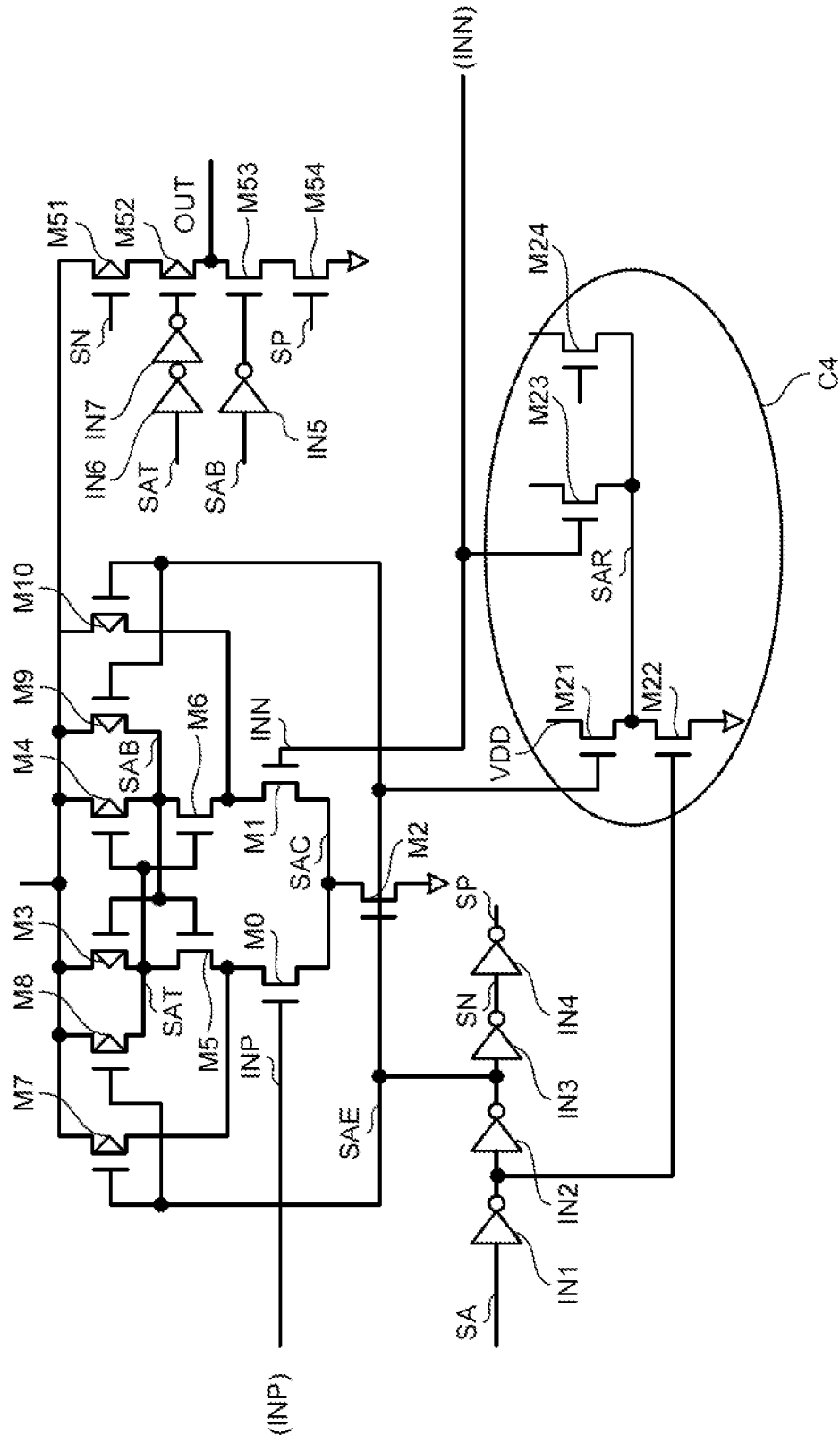
FIG. 11 is an explanatory diagram of an exemplary circuit configuration of a determination circuit according to a first modification of the second embodiment.

FIG. 11 is an explanatory diagram of an exemplary circuit configuration of a determination circuit according to a first modification of the second embodiment.

In FIG. 11, the same components as those described in the second embodiment with reference to FIG. 9 are denoted by the same reference signs.

The first modification of the second embodiment is different from the second embodiment in that an N-channel MOS transistor M24 is provided as illustrated in an ellipse C4.

The N-channel MOS transistor M24 also functions as a capacitive element (second capacitive element) similarly to the N-channel MOS transistor M23.

In addition, the N-channel MOS transistor M24 is formed by the same process as the N-channel MOS transistor M0, and is of the same type and size as the N-channel MOS transistor M0.

Since operation according to the first modification of the second embodiment is similar to that of the second embodiment illustrated in FIG. 10, the detailed description is incorporated.

In this case, a parasitic capacitance component corresponding to the signal SAC matches a parasitic capacitance component corresponding to the signal SAR. Therefore, the timing of the voltage fluctuation caused by the transition of the signal SAC and the timing of applying the signal to cancel the voltage fluctuation by the N-channel MOS transistor M23 based on the signal SAP can be matched with each other as compared with the case of the second embodiment.

Figure 12:
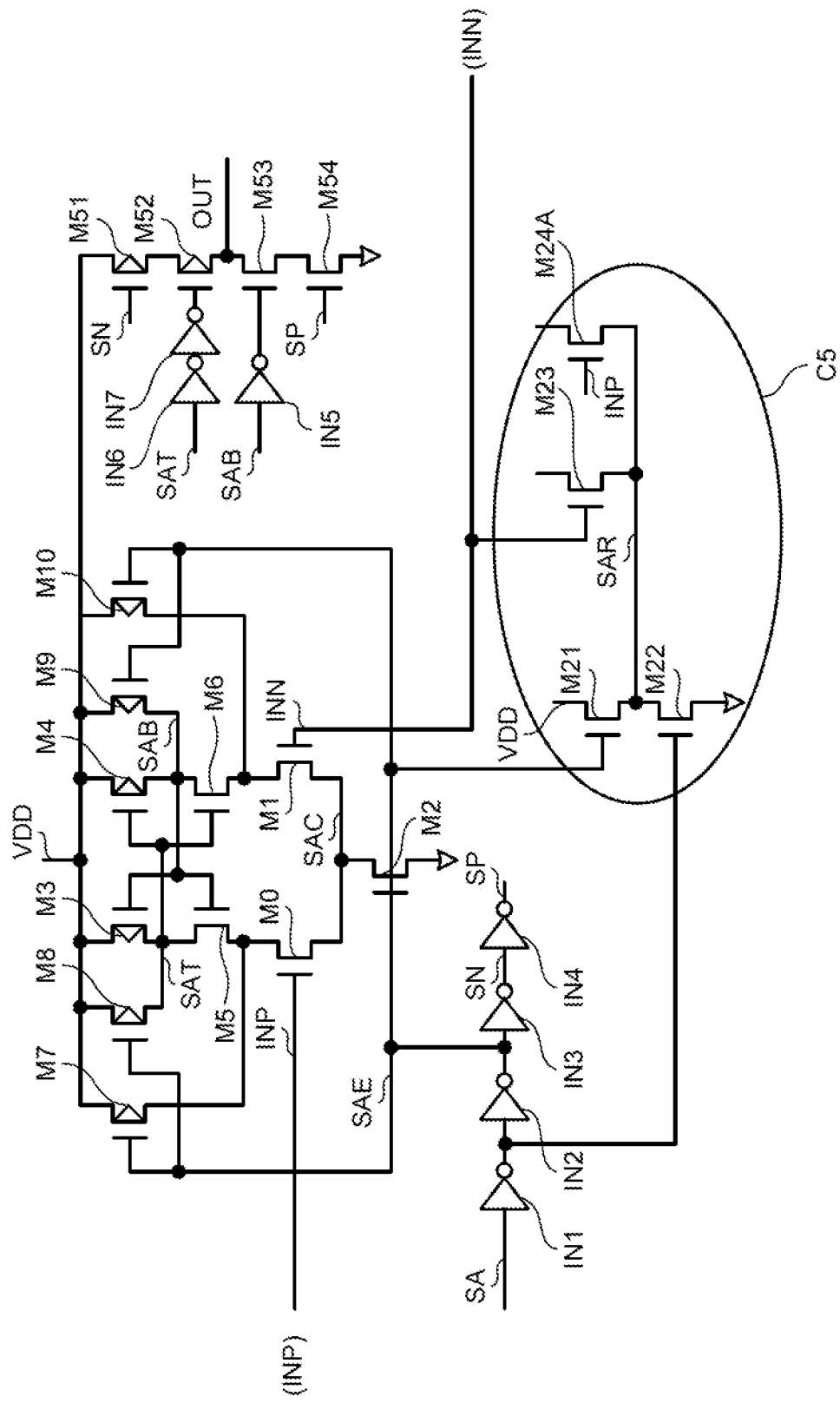
FIG. 12 is an explanatory diagram of an exemplary circuit configuration of a determination circuit according to a second modification of the second embodiment.

As a result, as illustrated in FIG. 12, the potential fluctuation of the reference voltage Ref can be more reliably suppressed only by adding the four N-channel MOS transistors M21 to M24.

That is, according to the first modification of the second embodiment, since the parasitic capacitance component corresponding to the signal SAC and the parasitic capacitance component corresponding to the signal SAR can be matched, the timing of canceling the potential fluctuation can be more matched with the timing of the potential fluctuation of the input signal INN corresponding to the reference voltage Ref, and the potential fluctuation can be more reliably suppressed.

As a result, a more reliable determination result can be obtained.

[2.2] Second Modification of Second Embodiment

FIG. 12 is an explanatory diagram of an exemplary circuit configuration of a determination circuit according to a second modification of the second embodiment.

In FIG. 12, the same components as those described in the first modification of the second embodiment with reference to FIG. 11 are denoted by the same reference signs.

The second modification of the second embodiment is different from the first modification of the second embodiment in that an N-channel MOS transistor M24A to which an input signal INP of a bit line BLx is applied via a gate terminal is provided instead of the N-channel MOS transistor M24 as illustrated in an ellipse C5.

The N-channel MOS transistor M24A also functions as a capacitive element similarly to the N-channel MOS transistor M23.

In addition, the N-channel MOS transistor M24A is also formed by the same process as the N-channel MOS transistor M0 similarly to the N-channel MOS transistor M24, and is of the same type and size as the N-channel MOS transistor M0.

As a result, the reference voltage generation circuit 14 is connected to the gate terminal of the N-channel MOS transistor M23, the input signal INN corresponding to the reference voltage Ref is applied to the gate terminal of the N-channel MOS transistor M23 to suppress the potential fluctuation of the corresponding reference voltage Ref, the bit line BLx is connected to the gate terminal of the N-channel MOS transistor M24A, and the input signal INP is applied to the gate terminal of the N-channel MOS transistor M24A to suppress the potential fluctuation of the input signal INP.

Therefore, according to the second modification of the second embodiment, it is possible to suppress the potential fluctuation of both the input signal INN and the input signal INP and to obtain a determination result more stably.

[2.3] Third Modification of Second Embodiment

Figure 13:
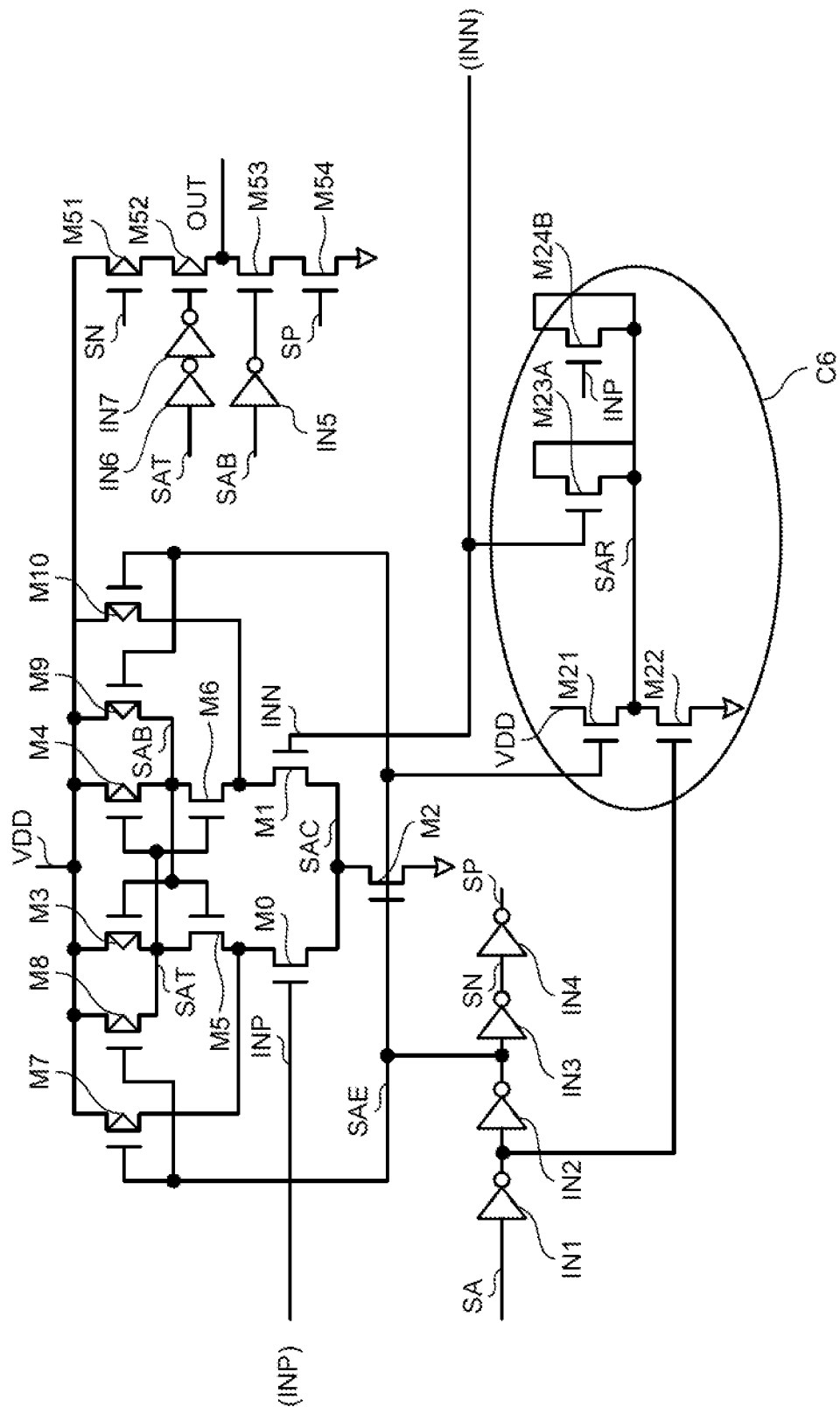
FIG. 13 is an explanatory diagram of an exemplary circuit configuration of a determination circuit according to a third modification of the second embodiment.

FIG. 13 is an explanatory diagram of an exemplary circuit configuration of a determination circuit according to a third modification of the second embodiment.

In FIG. 13, the same components as those described in the second modification of the second embodiment with reference to FIG. 12 are denoted by the same reference signs.

The third modification of the second embodiment is different from the second modification of the second embodiment in that, as illustrated in an ellipse C6, instead of the N-channel MOS transistor M23, an N-channel MOS transistor M23A is provided, which has a drain terminal that is connected to the output terminal of the inverter IN2 similarly to the source terminal of the N-channel MOS transistor M23A and to which the determination circuit enable signal SAE is input, and instead of the N-channel MOS transistor M24, an N-channel transistor M24B is provided, which has a drain terminal that is connected to the output terminal of the inverter IN2 similarly to the source terminal of the N-channel transistor 24B and to which the determination circuit enable signal SAE is input.

According to the third modification of the second embodiment, as compared with the second modification of the second embodiment, the potential states of the N-channel MOS transistors M23A and M24B can be further stabilized, and stable operation can be expected.

[3] Third Embodiment

Figure 14:
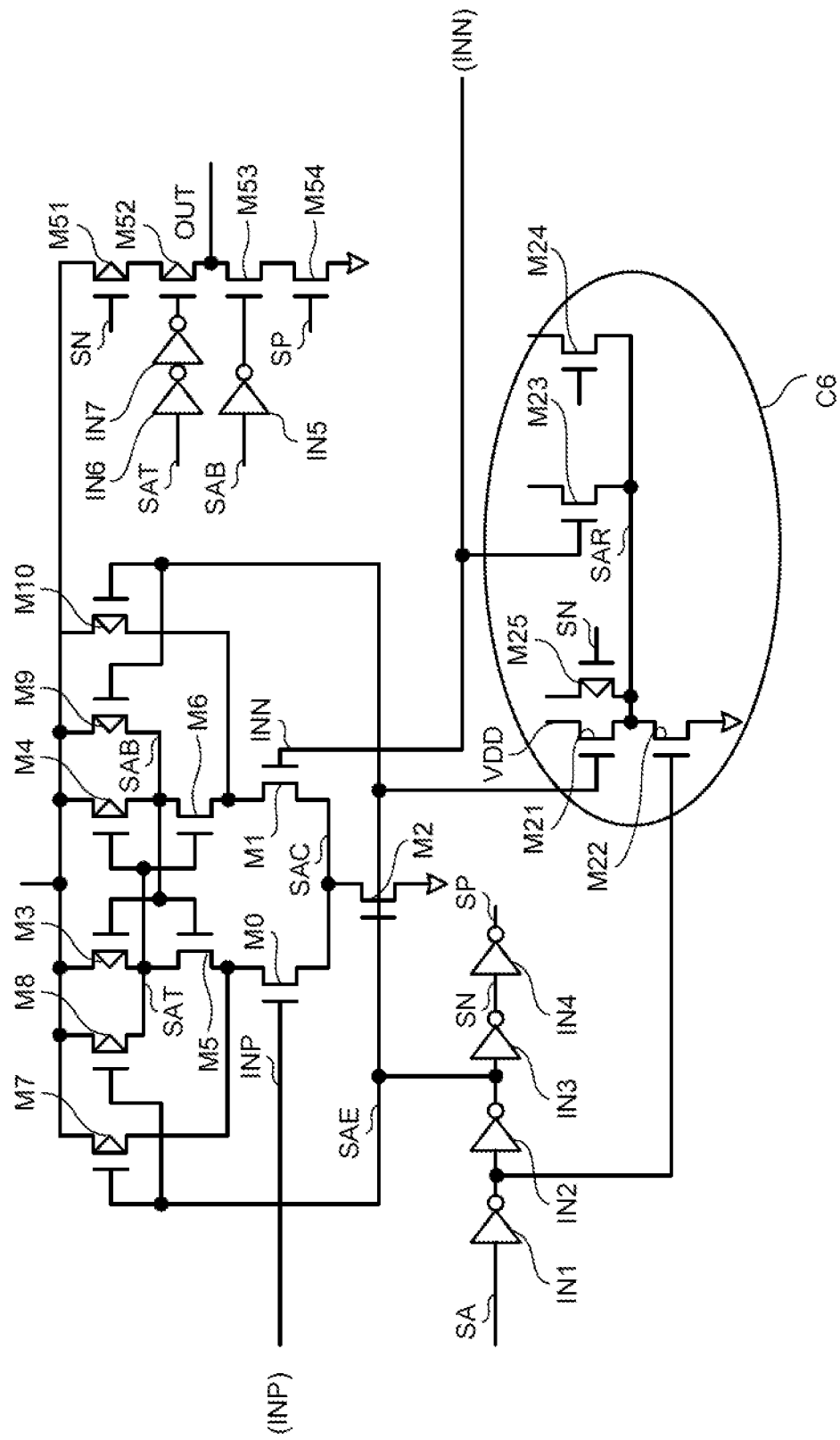
FIG. 14 is an explanatory diagram of an exemplary circuit configuration of a determination circuit according to a third embodiment.

FIG. 14 is an explanatory diagram of an exemplary circuit configuration of a determination circuit according to the third embodiment.

In FIG. 14, the same components as those described in the second embodiment with reference to FIG. 9 are denoted by the same reference signs.

The third embodiment is different from the second embodiment in that, as illustrated in an ellipse C7, a P-channel MOS transistor M25 is provided, which has a gate terminal connected to the output terminal of the inverter IN3, a drain terminal in a floating state, and a source terminal connected to the connection point of the source terminal of the N-channel MOS transistor M21 and the drain terminal of the N-channel MOS transistor M22, and the signal SN is input to the gate terminal of the P-channel MOS transistor M25.

According to the third embodiment, in addition to the same effects as those of the second embodiment, since the potential of the signal SAR at the "H" level can be shifted to the high-potential-side power supply VDD, the sizes and the installation areas of the N-channel MOS transistors M21 and M23 functioning as capacitive elements can be reduced. Therefore, the installation area of the determination circuit can be further reduced, and the SRAM can be highly integrated.

[3.1] First Modification of Third Embodiment

Figure 15:
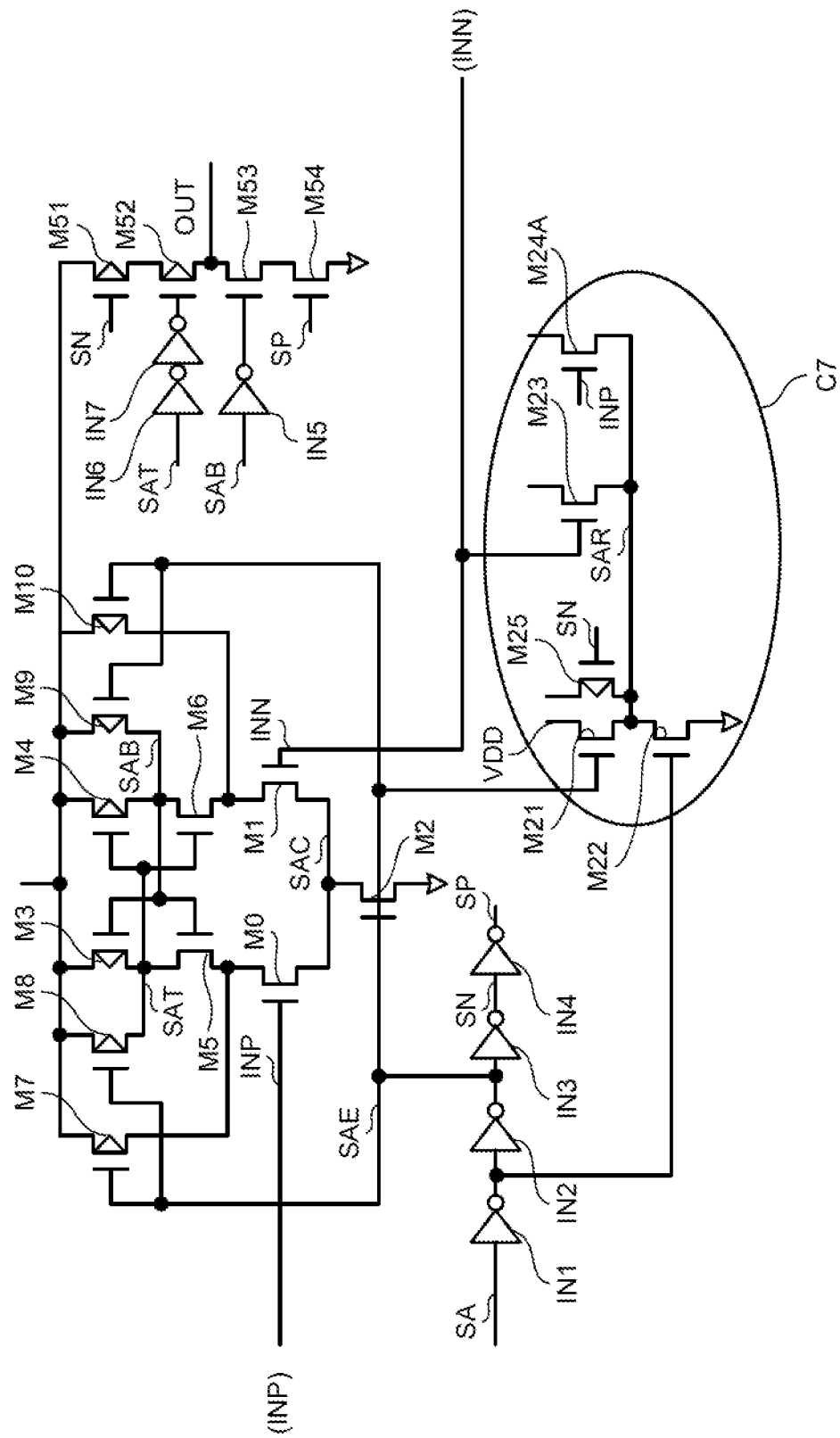
FIG. 15 is an explanatory diagram of an exemplary circuit configuration of a determination circuit according to a first modification of the third embodiment.

FIG. 15 is an explanatory diagram of an exemplary circuit configuration of a determination circuit according to a first modification of the third embodiment.

In FIG. 15, the same components as those described in the second modification of the second embodiment with reference to FIG. 12 are denoted by the same reference signs.

The first modification of the third embodiment is different from the second modification of the second embodiment in that, as illustrated in an ellipse C8, a P-channel MOS transistor M25 is provided, which has a gate terminal connected to the output terminal of the inverter IN3, a drain terminal in a floating state, and a source terminal connected to the connection point of the source terminal of the N-channel MOS transistor M21 and the drain terminal of the N-channel MOS transistor M22, and the signal SN is input to the gate terminal of the P-channel MOS transistor M25.

According to the first modification of the third embodiment, in addition to the same effects as those of the second modification of the second embodiment, since the potential of the signal SAR at the "H" level can be shifted to the high-potential-side power supply VDD, the sizes and the installation areas of the N-channel MOS transistors M21 and M23 functioning as capacitive elements can be reduced. Therefore, the installation area of the determination circuit can be further reduced, and eventually, the SRAM can be highly integrated.

[3.2] Second Modification of Third Embodiment

Figure 16:
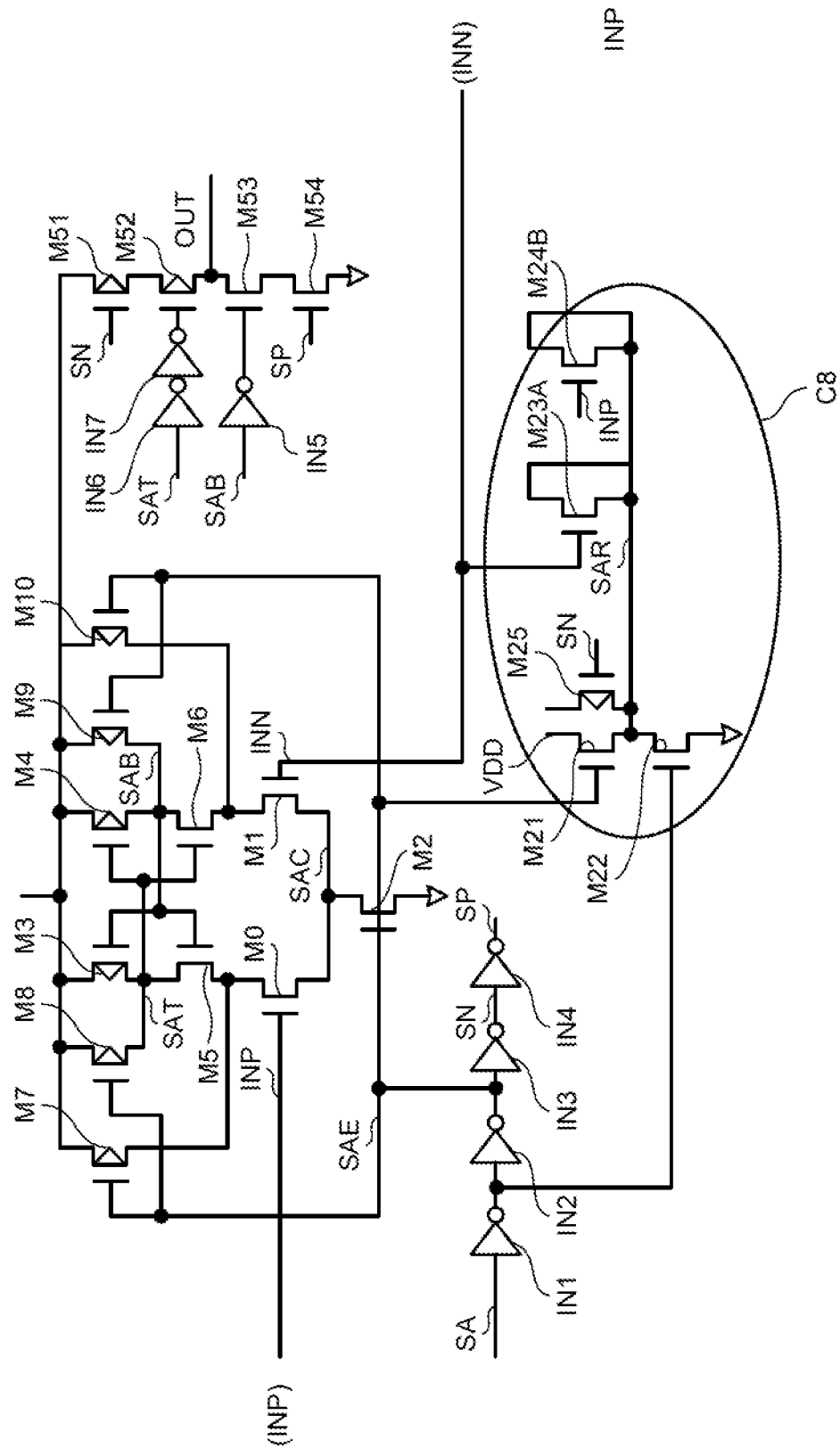
FIG. 16 is an explanatory diagram of an exemplary circuit configuration of a determination circuit according to a second modification of the third embodiment.

FIG. 16 is an explanatory diagram of an exemplary circuit configuration of a determination circuit according to a second modification of the third embodiment.

In FIG. 16, the same components as those described in the third modification of the second embodiment with reference to FIG. 13 are denoted by the same reference signs.

The second modification of the third embodiment is different from the third modification of the second embodiment in that, as illustrated in an ellipse C9, a P-channel MOS transistor M25 is provided, which has a gate terminal connected to the output terminal of the inverter IN3, a drain terminal connected to the high-potential-side power supply VDD, and a source terminal connected to the connection point of the source terminal of the N-channel MOS transistor M21 and the drain terminal of the N-channel MOS transistor M22, and the signal SN is input to the gate terminal of the P-channel MOS transistor M25.

According to the second modification of the third embodiment, in addition to the same effects as those of the third modification of the second embodiment, since the potential of the signal SAR at the "H" level can be shifted to the high-potential-side power supply VDD, the sizes and the installation areas of the N-channel MOS transistors M21 and M23 functioning as capacitive elements can be reduced. Therefore, the installation area of the determination circuit can be further reduced, and eventually, the SRAM can be highly integrated.

[4] Fourth Embodiment

Figure 17:
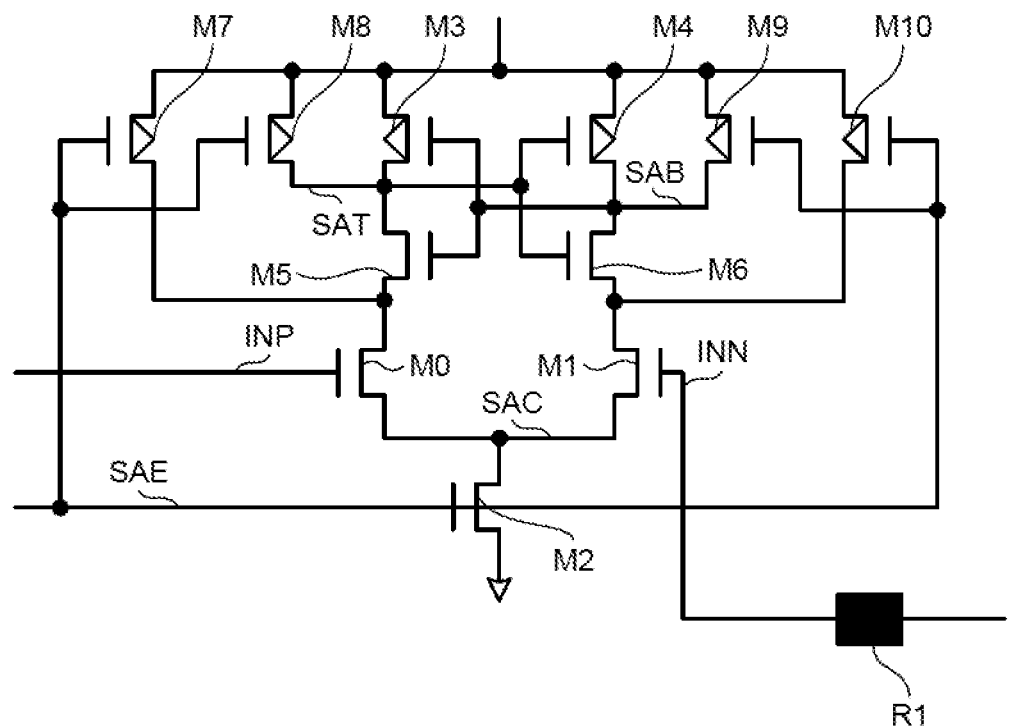
FIG. 17 is an explanatory diagram of an exemplary circuit configuration of a determination circuit according to a fourth embodiment.

FIG. 17 is an explanatory diagram of an exemplary circuit configuration of a determination circuit according to a fourth embodiment.

In FIG. 17, differences from the first embodiment in FIG. 2 are that the N-channel MOS transistor M11 is not provided and a resistance element R1 is provided on the input line of the reference voltage Ref generated by the reference voltage generation circuit 14.

As a result, by forming an RC filter with the parasitic capacitance between the source terminal and the gate terminal of the N-channel MOS transistor M1, it is possible to reduce the influence of coupling noise during operation of the determination circuit and stably perform determination.

In this case, if the resistance value of the resistance element R1 is set to be relatively high, coupling noise can be further reduced, but the time until the reference voltage Ref is stabilized at the gate terminal of the N-channel MOS transistor M11 becomes long, so that a determination time becomes long.

On the other hand, if the resistance value of the resistance element R1 is set relatively low, the time until the reference voltage Ref is stabilized at the gate terminal of the N-channel MOS transistor M11 is shortened, so that the determination time becomes short, but the influence of the coupling noise is hardly reduced, so that the possibility of causing erroneous determination increases.

Therefore, it is desirable to appropriately determine the resistance value of the resistance element R1 in consideration of both the determination time and the possibility of erroneous determination.

[4.1] First Modification of Fourth Embodiment

Figure 18:
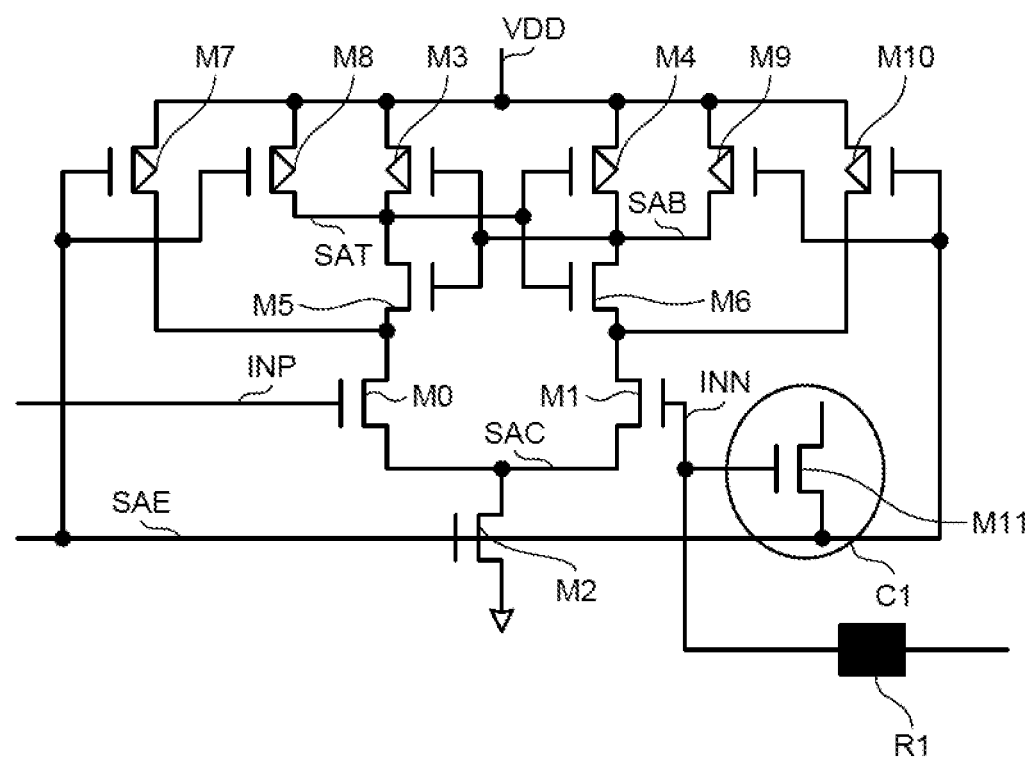
FIG. 18 is an explanatory diagram of an exemplary circuit configuration of a determination circuit according to a first modification of the fourth embodiment.

FIG. 18 is an explanatory diagram of an exemplary circuit configuration of a determination circuit according to a first modification of the fourth embodiment.

In FIG. 18, a difference from the first embodiment in FIG. 2 is that the resistance element R1 is provided on the input line of the reference voltage Ref generated by the reference voltage generation circuit 14.

As a result, in addition to the effects of the first embodiment, by forming an RC filter with the parasitic capacitance between the source terminal and the gate terminal of the N-channel MOS transistor M1 similarly to the fourth embodiment, it is possible to reduce the influence of coupling noise during operation of the determination circuit and stably perform determination. In this case, the determination of the resistance value of the resistance element R1 is the same as in the fourth embodiment.

[4.2] Second Modification of Fourth Embodiment

In the first modification of the fourth embodiment described above, the resistance element R1 is further provided in the configuration of the first embodiment. However, in the embodiments described after the first modification of the first embodiment, it is also possible to reduce the influence of coupling noise during operation of the determination circuit and stably perform determination by similarly providing the resistance element R1 to form an RC filter.

[5] Other Aspects of Embodiments

Although the embodiments of the present invention have been described, these embodiments have been presented as examples, and are not intended to limit the scope of the invention. These novel embodiments can be implemented in various other forms, and various omissions, substitutions, and changes can be made without departing from the gist of the invention. These embodiments and the modifications thereof are included in the scope and gist of the invention, and are included in the invention described in the claims and the equivalent scope thereof.

[5.1] First Aspect of Embodiments

According to a first aspect of the embodiments, a determination circuit includes a capacitive element that has one end connected to an input terminal of a differential pair included in a differential type determination circuit, and shifts a potential of the input terminal so as to reduce a potential fluctuation of the input terminal that occurs due to start of operation of the differential pair, wherein the other end of the capacitive element is connected to an operation control signal line for performing operation control of the differential pair.

[5.2] Second Aspect of Embodiments

According to a second aspect of the embodiments, a determination circuit includes a capacitive element that has one end connected to an input terminal of a differential pair included in a differential type determination circuit, and shifts a potential of the input terminal so as to reduce a potential fluctuation of the input terminal that occurs due to start of operation of the differential pair, wherein the capacitive element is provided at each of input terminals of the differential pair.

In this case, the other end of the capacitive element may be connected to an operation control signal line for performing operation control of the differential pair.

[5.3] Third Aspect of Embodiments

In the first aspect or the second aspect, the capacitive element may be configured as a MOS transistor.

[5.4] Fourth Aspect of Embodiments

In the third aspect of the embodiments, the capacitive element may be configured as parasitic capacitance between a gate terminal of the MOS transistor and a drain terminal or a source terminal of the MOS transistor.

[5.5] Fifth Aspect of Embodiments

In any one of the first to fourth aspects, the differential pair may include a pair of MOS transistors, and the capacitive element may include a MOS transistor of the same type and size as those of the MOS transistors constituting the differential pair corresponding to the connected input terminal.

[5.6] Sixth Aspect of Embodiments

In any one of the first to fifth aspects, either the drain terminal or the source terminal of the MOS transistor constituting the capacitive element may be in a floating state.

[5.7] Seventh Aspect of Embodiments

In any one of the first to fifth aspects, the drain terminal and the source terminal of the MOS transistor constituting the capacitive element may be connected to the operation control signal line for performing operation control of the differential pair.

[5.8] Eighth Aspect of Embodiments

According to an eighth aspect of the embodiments, a determination circuit includes a capacitive element that has one end connected to an input terminal of a differential pair included in a differential type determination circuit, and shifts a potential of the input terminal so as to reduce a potential fluctuation of the input terminal that occurs due to start of operation of the differential pair, and includes a first MOS transistor having a gate terminal connected to an operation control signal line for performing operation control of the differential pair, and a drain terminal or a source terminal connected to the other end of the capacitive element, wherein the capacitive element is configured as parasitic capacitance between the gate terminal and the drain terminal or the source terminal of the first MOS transistor.

[5.9] Ninth Aspect of Embodiments

According to a ninth aspect of the embodiments, a correction method executed by a differential type determination circuit including a differential pair includes: a process of detecting start of operation of the differential pair; and a process of shifting a potential of an input terminal of the differential pair so as to reduce a potential fluctuation of the input terminal that occurs due to the start of the operation.

What is claimed is:

1. A determination circuit comprising:
a differential pair included in a differential type determination circuit, one input terminal of the differential pair receiving a voltage of a bit line of a memory and another input terminal of the differential pair receiving a reference voltage; and
a first capacitive element that has one end connected to the other input terminal of the differential pair and another end receiving a determination circuit enable signal, the first capacitive element shifting, based on the determination circuit enable signal, a potential of the other input terminal so as to reduce a potential fluctuation of the other input terminal that occurs due to start of operation of the differential pair so that a difference between the voltage of the bit line and the reference voltage does not become small.

2. The determination circuit according to claim 1, further comprising
a first MOS transistor having a gate terminal connected to an operation control signal line for performing operation control of the differential pair, and a drain terminal or a source terminal connected to the other end of the first capacitive element.

3. The determination circuit according to claim 2, further comprising
a second MOS transistor having a gate terminal connected to the operation control signal line, a drain terminal connected to the differential pair, and a source terminal connected to a power supply, wherein
the first MOS transistor is of the same type and the same size as the second MOS transistor.

4. The determination circuit according to claim 2, further comprising
a third MOS transistor having a source terminal connected to the source terminal of the first MOS transistor and a gate terminal to which an inverted signal of an operation control signal corresponding to the operation control signal line is input, wherein
one of the first MOS transistor and the third MOS transistor is configured as an N-channel MOS transistor, and the other of the first MOS transistor and the third MOS transistor is configured as a P-channel MOS transistor.

5. The determination circuit according to claim 2, further comprising
a second capacitive element having one end connected to the other end of the first capacitive element.

6. The determination circuit according to claim 2, wherein the capacitive element is configured as a MOS transistor.

7. The determination circuit according to claim 2, wherein either a drain terminal or a source terminal of a MOS transistor constituting the capacitive element is in a floating state.

8. The determination circuit according to claim 2, wherein
a drain terminal and a source terminal of a MOS transistor constituting the capacitive element are connected to the operation control signal line.

9. The determination circuit according to claim 1, wherein
a resistive element constituting an RC filter is connected in series to the input terminal of the differential pair included in the differential type determination circuit.

10. The determination circuit according to claim 1, wherein
the other end of the capacitive element is connected to an operation control signal line for performing operation control of the differential pair.

11. The determination circuit according to claim 1, wherein
the capacitive element is provided at each of input terminals of the differential pair.

12. The determination circuit according to claim 1, wherein
the capacitive element is configured as a MOS transistor.

13. The determination circuit according to claim 12, wherein
the capacitive element is configured as parasitic capacitance between a gate terminal and a drain terminal or a source terminal of the MOS transistor.

14. The determination circuit according to claim 1, wherein
the differential pair includes a pair of MOS transistors, and
the capacitive element is of the same type as the MOS transistors constituting the differential pair corresponding to the connected input terminal, and includes a MOS transistor having the same size as the MOS transistors constituting the differential pair.

15. The determination circuit according to claim 1, wherein
either a drain terminal or a source terminal of a MOS transistor constituting the capacitive element is in a floating state.

16. The determination circuit according to claim 1, wherein
a drain terminal and a source terminal of aMOS transistor constituting the capacitive element are connected to an operation control signal line for performing operation control of the differential pair.

17. A correction method executed by a differential type determination circuit including a differential pair, the correction method comprising:
receiving at one input terminal of the differential pair, a voltage of a bit line of a memory;
receiving at another input terminal of the differential pair, a reference voltage;
detecting a start of operation of the differential pair;
receiving, at a first capacitive element, a determination circuit enable signal; and
based on the determination circuit enable signal, shifting a potential of the other input terminal of the differential pair so as to reduce a potential fluctuation of the other input terminal that occurs due to the start of the operation of the differential pair so that a difference between the voltage of the bit line and the reference voltage does not become small.

* * * * *